(12) United States Patent
Tsai et al.

(10) Patent No.: US 12,091,752 B2
(45) Date of Patent: Sep. 17, 2024

(54) APPARATUS AND METHOD OF MANUFACTURING INTERCONNECT STRUCTURES

(71) Applicant: Taiwan Semiconductor Manufacturing Company Limited, Hsinchu (TW)

(72) Inventors: Yu-Ting Tsai, New Taipei (TW); Chung-Liang Cheng, Changhua (TW); Wen-Cheng Cheng, Hsinchu (TW); Che-Hung Liu, Hsinchu (TW); Yu-Cheng Shen, Hsinchu County (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 586 days.

(21) Appl. No.: 17/249,909

(22) Filed: Mar. 18, 2021

(65) Prior Publication Data

US 2022/0298634 A1    Sep. 22, 2022

(51) Int. Cl.
*C23C 16/455*    (2006.01)
*C23C 16/505*    (2006.01)
(Continued)

(52) U.S. Cl.
CPC ...... *C23C 16/45536* (2013.01); *C23C 16/505* (2013.01); *H01J 37/32082* (2013.01);
(Continued)

(58) Field of Classification Search
CPC ......... H01L 21/67023; H01L 21/76877; H01L 23/5226; H01L 23/53219; H01L 21/67184; H01L 21/67011; H01L 23/528; H01L 23/53233; H01L 2221/10682; C23C 16/45536; C23C 16/505; C23C 14/35; C23C 14/14; C23C 14/3407;
(Continued)

(56) References Cited

U.S. PATENT DOCUMENTS 6,140,236 A  * 10/2000 Restaino ......... H01L 21/76877
                                                257/E21.585
6,436,824 B1 *  8/2002 Chooi ................ H01L 21/3125
                                                           438/758
(Continued)

FOREIGN PATENT DOCUMENTS

CN          108004516 A        5/2018
TW          201532126 A        8/2015
WO       WO-0184619 A2  * 11/2001 ........... G09G 3/3291

*Primary Examiner* — Ermias T Woldegeorgis
(74) *Attorney, Agent, or Firm* — Harrity & Harrity, LLP

(57) ABSTRACT

An apparatus for manufacturing a semiconductor device may include a chamber, a chuck provided in the chamber, and a biased power supply physically connected with the chuck. The apparatus may include a target component provided over the chuck and the biased power supply, and a magnetron assembly provided over the target component. The magnetron assembly may include a plurality of outer magnetrons and a plurality of inner magnetrons, and a spacing between each adjacent magnetrons of the plurality of outer magnetrons may be different from a spacing between each adjacent magnetrons of the plurality of inner magnetrons.

20 Claims, 11 Drawing Sheets

(51) Int. Cl.
    *H01J 37/32*       (2006.01)
    *H01L 21/67*       (2006.01)
    *H01L 21/768*     (2006.01)
    *H01L 23/522*     (2006.01)
    *H01L 23/532*     (2006.01)

(52) U.S. Cl.
    CPC .... *H01J 37/3266* (2013.01); *H01L 21/67023* (2013.01); *H01L 21/76877* (2013.01); *H01L 23/5226* (2013.01); *H01L 23/53219* (2013.01)

(58) Field of Classification Search
    CPC ..... C23C 14/345; C23C 14/50; C23C 14/568; H01J 37/32082; H01J 37/3266; H01J 37/3408; H01J 37/345; H01J 37/3452
    See application file for complete search history.

(56) References Cited

U.S. PATENT DOCUMENTS

| | | | |
|---|---|---|---|
| 6,440,282 B1 | 8/2002 | Wada et al. | |
| 7,186,319 B2 | 3/2007 | Yang et al. | |
| 9,790,589 B2 | 10/2017 | West et al. | |
| 10,854,434 B2 | 12/2020 | Yang et al. | |
| 2005/0221554 A1* | 10/2005 | Huang | H01L 21/76838 257/E21.585 |
| 2008/0260966 A1 | 10/2008 | Hanawa et al. | |
| 2019/0035611 A1 | 1/2019 | Chung et al. | |

\* cited by examiner

APPARATUS AND METHOD OF MANUFACTURING INTERCONNECT STRUCTURES

BACKGROUND

Back end of line (BEOL) is a portion of integrated circuit (IC) fabrication where individual devices (e.g., transistors, capacitors, resistors, and/or the like) get interconnected with wiring (e.g., a metallization layer) on a semiconductor wafer. Common metals utilized in BEOL processes include copper, tantalum, titanium, tungsten, aluminum, and/or a combination thereof. BEOL generally begins when a first layer of metal is deposited on the semiconductor wafer. BEOL includes insulating layers (e.g., dielectric layers, passivation layers, and/or the like), metal levels, bonding sites, and/or the like for chip-to-package connections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
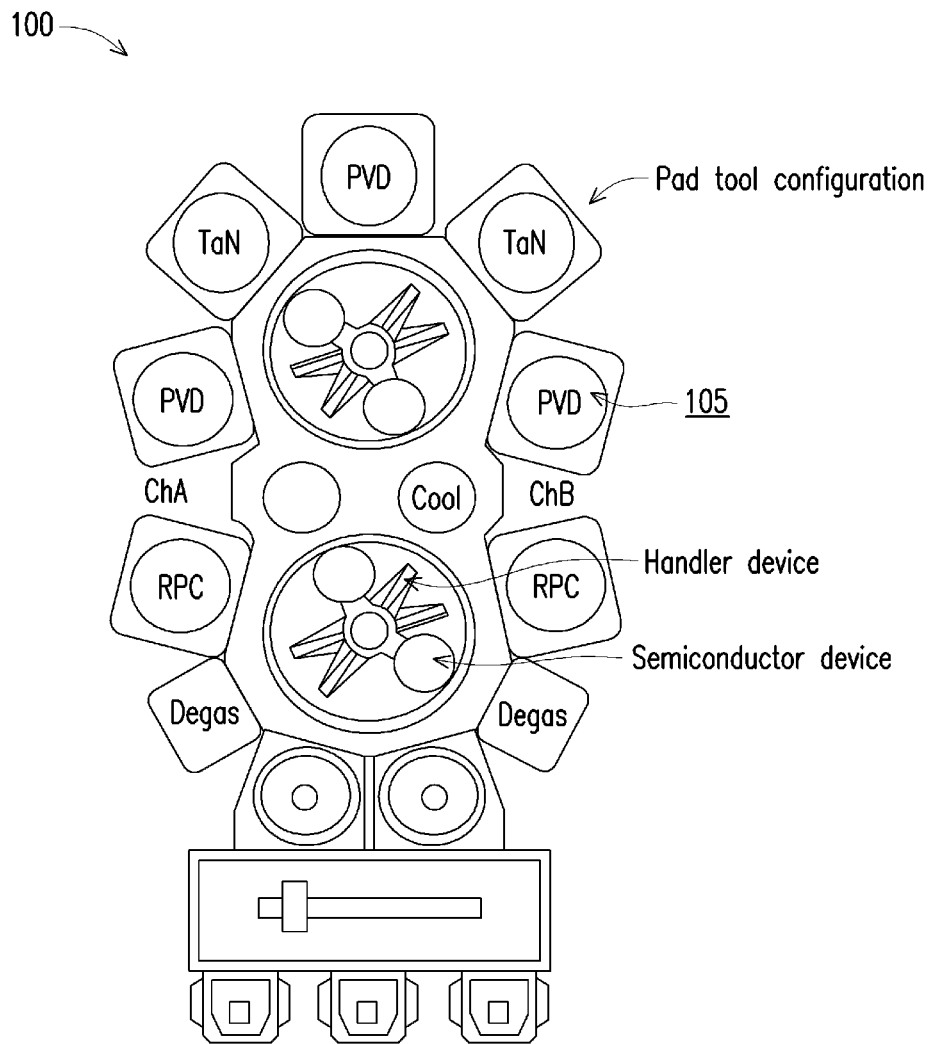
FIGS. 1A-1E are diagrams of one or more example implementations of semiconductor processing tools described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a deposition apparatus may deposit an aluminum copper layer on a semiconductor device during a BEOL process. In such cases, a physical vapor deposition (PVD) apparatus may not bias power provided to a chuck that heats the semiconductor device prior to deposition of the aluminum copper layer on the semiconductor device. For example, the semiconductor device includes a metal layer with a first insulation layer (e.g., a first passivation layer) provided on top of the metal layer. Openings (e.g., vias) are provided in the first insulation layer to expose portions of the metal layer. The PVD chamber deposits the aluminum copper layer on the first insulation layer and within the openings provided in the first insulation layer. Thus, the aluminum copper layer is provided on top of the exposed portions of the metal layer. A second insulation layer (e.g., a second passivation layer) is provided on top of the aluminum copper layer, and a bumping chemical layer is provided on top of the second insulation layer. However, since the PVD chamber fails to bias the power provided to the chuck that heats the semiconductor device prior to deposition of the aluminum copper layer, voids or pinholes are formed in the aluminum copper layer deposited within the openings provided in the first insulation layer. Such voids prevent the second insulation layer from completely covering the aluminum copper layer at particular portions of the aluminum copper layer. The bumping chemical layer contacts the aluminum copper layer at the particular portions of the aluminum copper layer and damages the aluminum copper layer.

According to some implementations described herein, a device (e.g., a PVD chamber) for manufacturing a semiconductor device includes a biased power supply for a chuck component that prevents formation of voids in an aluminum copper layer of the semiconductor device and improves performance of the semiconductor device. In some implementations, the device for manufacturing the semiconductor device includes a chuck component to support the semiconductor device and to provide heat to the semiconductor device, and a biased power supply to provide a biased power to the chuck component. The device may include a target component to provide an aluminum copper layer on a metal layer and an insulation layer of the semiconductor device. The insulation layer may be provided on the metal layer and includes vias, and the aluminum copper layer, provided on the metal layer, may fill the vias included in the insulation layer. The device may include a magnetron to generate a magnetic field that causes the target component to provide the aluminum copper layer on the metal layer and the insulation layer of the semiconductor device. The magnetron may be rotated to generate the magnetic field that causes the target component to provide the aluminum copper layer on the metal layer and the insulation layer of the semiconductor device.

In this way, the PVD chamber prevents formation of voids in the aluminum copper layer of the semiconductor device and improves performance of the semiconductor device. Without formation of voids in the aluminum copper layer, a second insulation layer of the semiconductor device may completely cover the aluminum copper layer. Thus, a bumping chemical layer provided on top of the second insulation layer is unable to contact the aluminum copper layer and/or cause damage to the aluminum copper layer.

FIGS. 1A-1E are diagrams of one or more example implementations 100 of semiconductor processing tools described herein. As shown in FIG. 1A, a pad tool configuration may include one or more degas chambers, one or more reactive pre-clean (RPC) chambers, one or more tantalum nitride (TaN) chambers, one or more PVD chamber 105, and/or the like. Semiconductor devices may be provided to one or more of the aforementioned chambers via a handler device (e.g., a robotic arm, multiple robotic arms, and/or the like). In some implementations, the pad tool configuration is utilized to produce a semiconductor device described below in connection with FIGS. 2A-2H. In some implementations, the semiconductor device is first provided to the degas chamber, and the degas chamber processes the semiconductor device. The degas chamber provides the semiconductor device to the RPC chamber, and the RPC chamber processes the semiconductor device. The RPC chamber provides the semiconductor device to the TaN chamber, and the TaN chamber processes the semiconductor device. The TaN chamber provides the semiconductor device to PVD chamber 105, and PVD chamber 105 processes the semiconductor device.

The degas chamber may include a tool that activates and removes gaseous and/or liquid substances, such as moisture and oxygen, through heating. Without removal, these substances may prevent a thin film from being formed on a semiconductor device or may change characteristics of the thin film as the thin film is being formed by physical vapor deposition (PVD), chemical vapor deposition (CVD), and/or the like. In some implementations, the degas chamber includes a chamber that enables removal of the gaseous and/or liquid substances. The chamber may be filled with argon (Ar) gas that is maintained at a particular temperature (e.g., 200° Celsius, 230° C., and/or the like) and a particular pressure (e.g., 5 Torr, 6 Torr, 7 Torr, and/or the like).

The RPC chamber may include a tool that removes oxides (e.g., silicon oxide, aluminum oxide, copper oxide, and/or the like) from bottoms of vias without redeposition of material onto sidewalls of the vias, that removes contaminants from the sidewalls, and/or the like. The RPC chamber may perform a reactive pre-clean process based on a helium (He) and hydrogen ($H_2$) plasma. The RPC chamber may include a chamber that enables an optimized hydrogen plasma and an active wafer temperature control to ensure copper oxide reduction and via cleaning. The chamber may be filled with a particular quantity (e.g., 95%) of helium gas and a particular quantity (e.g., 5%) of hydrogen gas provided at a particular flow rate (e.g., 70, 80, 90, and/or the like standard cubic centimeter per minute, or sccm). The RPC chamber may apply a radio frequency (RF) bias power to the semiconductor device in a range from approximately 10 Watts (W) to approximately 750 W.

The TaN chamber may include a tool that provides insulation layers (e.g., tantalum nitride layers) on the semiconductor device. The TaN chamber may deposit tantalum nitride via physical vapor deposition (PVD), in a process known as reactive sputtering. This enables a purity of the sputter target material to be maintained in the deposited tantalum nitride layers and provides a process that is more easy to control than chemical vapor deposition (CVD). In some implementations, the TaN chamber includes a chamber that enables deposition of the insulation layers on the semiconductor device. The chamber may be filled with argon (Ar) gas and nitrogen gas that are maintained at a particular temperature (e.g., 100° C., 110° C., and/or the like). The argon gas may be provided at a particular flow rate (e.g., 80, 90, 100 and/or the like sccm), and the nitrogen gas may be provided at another particular flow rate (e.g., 25, 30, 35, and/or the like sccm). The TaN chamber may be powered with a particular direct current power (e.g., 4, 5, 6, and/or the like kilowatts (kW)).

PVD chamber 105 may include a tool that provides an aluminum copper layer on the semiconductor device. In some implementations, PVD chamber 105 includes a chamber that enables deposition of the aluminum copper layer on the semiconductor device. The chamber may be filled with argon (Ar) gas that is maintained at a particular temperature (e.g., 310° C., 330° C., and/or the like) and is provided at a particular flow rate (e.g., 20, 25, 30 and/or the like sccm). PVD chamber 105 may be powered with a direct current power in a range from approximately 20 kW to approximately 60 kW and an alternating current power in a range from approximately 100 W to approximately 1200 W. The alternating current power may be biased with a frequency in a range from approximately 2 megahertz (MHz) to approximately 81.36 MHz. Other ranges of direct current power and alternating current power may be utilized by PVD chamber 105. Further details of PVD chamber 105 are provided below in connection with FIGS. 1B-1E.

Figure 1B:
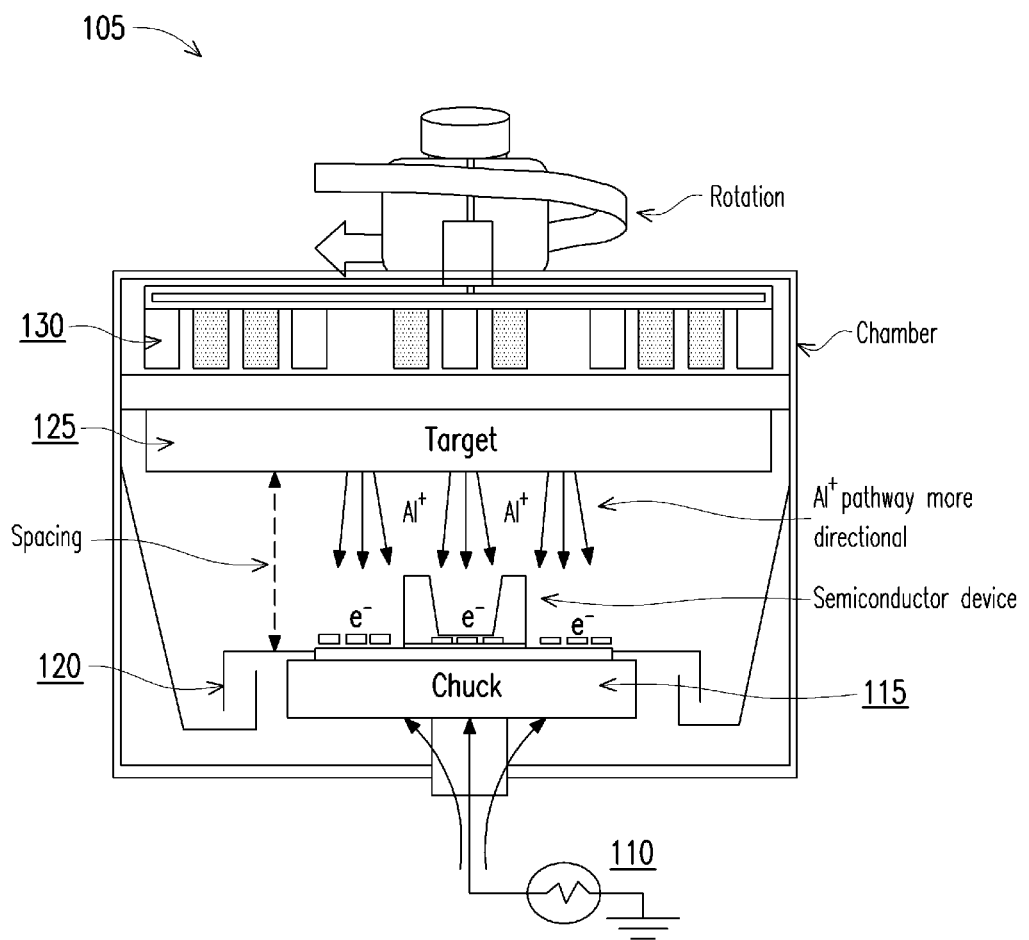

As shown in FIG. 1B, PVD chamber 105 may include a radio frequency (RF) biased power supply 110, a chuck component 115, a cover ring 120, a target component 125, and a magnetron 130. Chuck component 115, cover ring 120, target component 125, and magnetron 130 may be provided within a chamber of PVD chamber 105, and RF biased power supply 110 may be provided external to the chamber.

RF biased power supply 110 includes a device that supplies power to chuck component 115. The power supplied by RF biased power supply 110 may include a direct current (DC) power in a range from approximately 20 kW to approximately 60 kW and an alternating current (AC) power in a range from approximately 100 W to approximately 1200 W. The AC power may be biased with a frequency in a range from approximately 2 MHz to approximately 81.36 MHz.

Chuck component 115 includes a support pad that is sized and shaped to support the semiconductor device. The support pad may include one or more heating elements that receive the DC power and frequency-biased AC power from RF biased power supply 110 and generate heat for chuck component 115. The heat generated by chuck component 115 may be transferred to the semiconductor device based on the semiconductor device contacting the support pad of chuck component 115. In some implementations, a temperature of the heat generated by chuck component 115 is in range from approximately 300° C. to approximately 400° C. to prevent formation of voids in an aluminum copper layer of the semiconductor device and to improve performance of the semiconductor device, as described herein. Other ranges of temperatures may also be generated by chuck component 115.

Cover ring 120 includes a component that is sized and shaped to prevent plasma (e.g., aluminum copper plasma, argon plasma, and/or the like) leakage from the chamber of PVD chamber 105. In some implementations, cover ring 120 includes an extended portion (e.g., relative to cover rings utilized in conventional PVD chambers) that prevents plasma leakage from PVD chamber 105. Further details of cover ring 120 are provided below in connection with FIG. 1C.

Target component 125 includes a material that is used to create thin films on the semiconductor device, via a technique known as thin film deposition. For example, target component 125 may include an aluminum material, a copper material, an aluminum copper material, and/or the like. In some implementations, target component 125 includes a particular percentage of aluminum material (e.g., 99.5% Al) and a particular percentage of copper material (e.g., 0.5% copper). In some implementations, PVD chamber 105 may include multiple target components 125 (e.g., a first target component 125 made from an aluminum material and a second target component 125 made from a copper material). As further shown in FIG. 1B, a spacing provided between target component 125 and chuck component 115 may be in a range from approximately 60 mm to approximately 80 mm, although other ranges for the spacing may be provided, to prevent formation of voids in an aluminum copper layer of the semiconductor device and to improve performance of the semiconductor device, as described herein. The spacing may be greater than spacings utilized in prior PVD chambers and may provide improved gap fill and film uniformity of an Aluminum copper layer applied to the semiconductor device (e.g., relative to prior PVD chambers).

Magnetron 130 includes multiple magnetic columns that generate a magnetic field when magnetron 130 is rotated. In some implementations, one or more of the multiple magnetic columns include a first type of magnetic column, a second type of magnetic column, and/or the like. The first type of magnetic column may include a column diameter in a range from approximately fifteen millimeters to approximately eighteen millimeters and a column length in a range from approximately thirty millimeters to approximately thirty-five millimeters to prevent formation of voids in an aluminum copper layer of the semiconductor device and to improve performance of the semiconductor device, as described herein. Other column diameters and column lengths may also be utilized. The second type of magnetic column may include a standard magnetic column utilized in prior PVD chambers. The first type of magnetic column may provide a greater magnetic flux than a magnetic flux provided by the second type of magnetic column. Thus, the first type of magnetic column may provide a greater aluminum and argon ion density than an aluminum and argon ion density provided by the second type of magnetic column. By providing discontinuous magnetic columns, magnetron 130 may be redesigned to improve film uniformity of a deposited film. In comparison with other approaches, the film uniformity ranges from about 0.5% to about 1.7%. Further details of magnetron 130 are provided below in connection with FIGS. 1D and 1E.

In operation, since magnetron 130 is located behind target component 125, plasma generated from target component 125 may be confined to a target surface of the semiconductor device. Rotation of magnetron 130 may generate a magnetic field that forms a closed-loop annular path acting as an electron trap that reshapes trajectories of secondary electrons ejected from target component 125 into a cycloidal path, which increases a probability of ionization of a sputtering gas within the chamber. Inert gases (e.g., argon) may be employed as the sputtering gas because inert gases tend not to react with target component 125 or combine with any process gases and because inert gases produce higher sputtering and deposition rates due to high molecular weight. Positively charged argon ions from the plasma may be accelerated toward the negatively biased target component 125, resulting in material being dislodged from a surface of target component 125 and onto the semiconductor device. As further shown in FIG. 1B, the design of PVD chamber 105 may ensure that a pathway of aluminum ions (Al) onto the semiconductor device is more directional relative to aluminum ion pathways generated by prior PVD chambers (e.g., non-directional aluminum ion pathways that cause void formation).

Figure 1C:
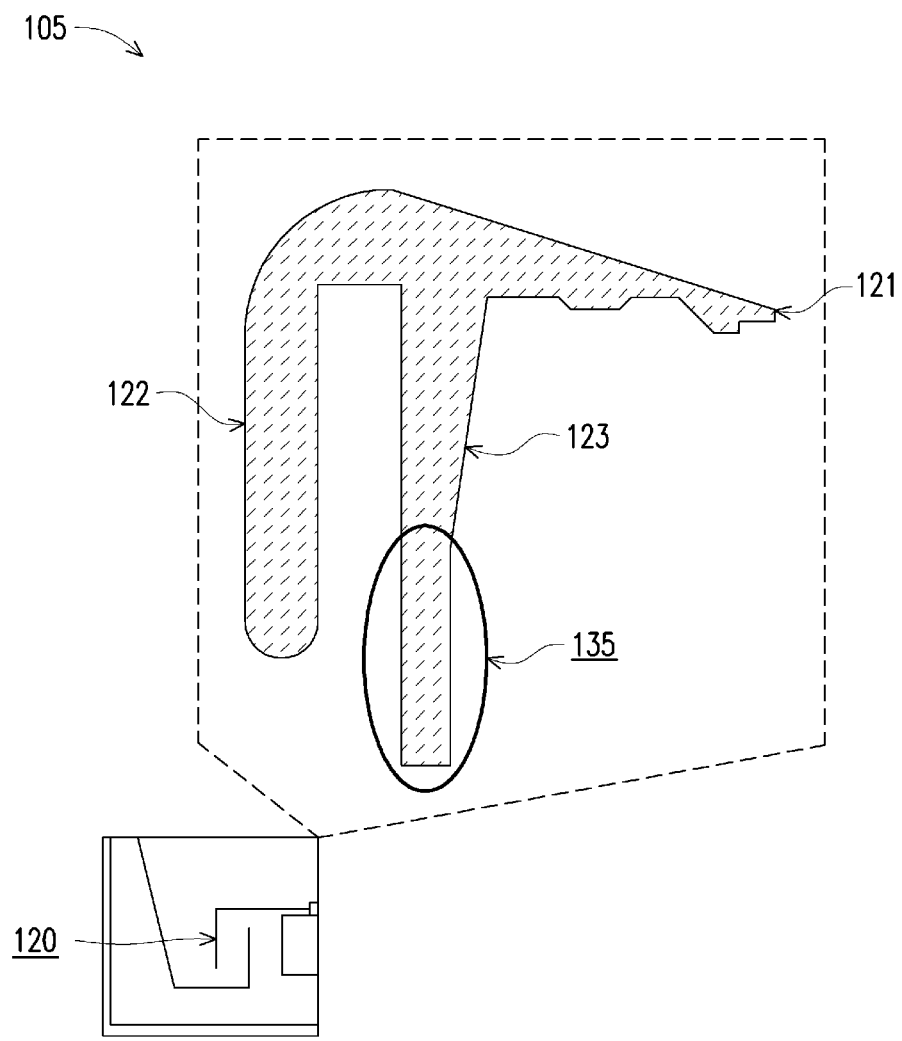

FIG. 1C is an enlarged view of cover ring 120 depicted in FIG. 1B. As shown in FIG. 1C, cover ring 120 of PVD chamber 105 may include a body portion 121 that is integrally formed with a first leg portion 122 and a second leg portion 123. Body portion 121 is positioned and coupled with an edge of chuck 115, and first leg portion 122 is far away from chuck 115 in comparison with second leg portion 123. In some implementations, cover ring 120 is sized and shaped based on a size and a shape of PVD chamber 105, a size and a shape of the semiconductor device processed by PVD chamber 105, and/or the like. As further shown in FIG. 1C, and by reference number 135, second leg portion 123 may be extended (e.g., relative to cover rings utilized in prior PVD chambers) in order to prevent plasma leakage from PVD chamber 105. In some implementations, second leg portion 123 is extended a particular length (e.g., greater than or equal to 15 millimeters (mm)) relative to cover rings utilized in prior PVD chambers. If the extended length is smaller than 15 mm, a plasma leakage increases, resulting in an undesired film profile, in some instances.

Figure 1D:
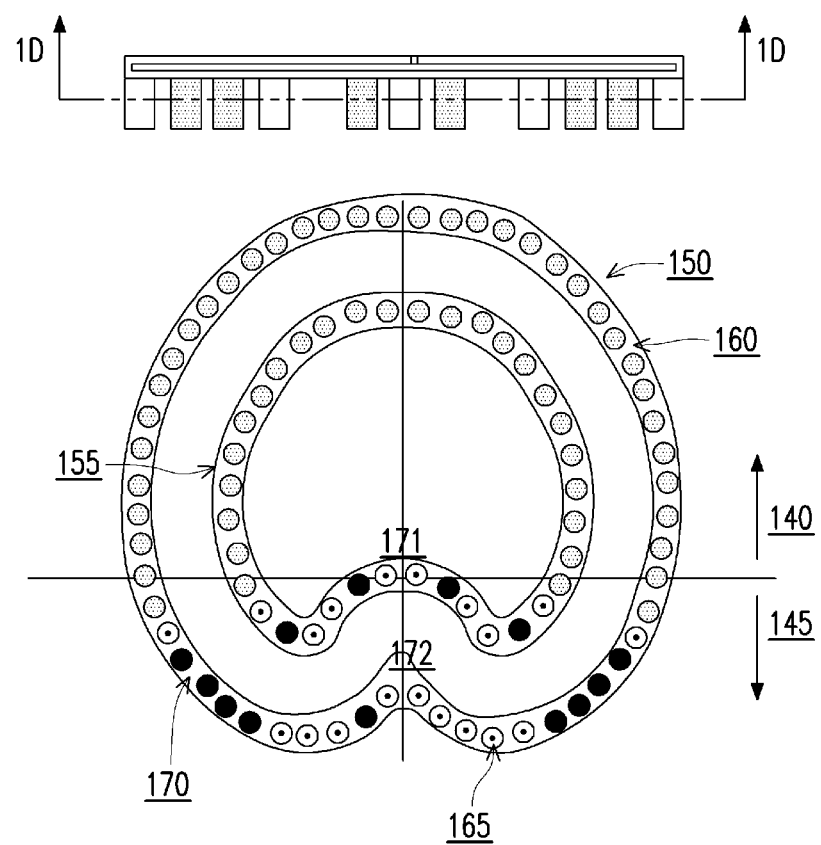

FIG. 1D is a cross-sectional view of magnetron 130 depicted in FIG. 1B, taken along line 1D-1D. As shown in FIG. 1D, magnetron 130 may be divided into different portions, such as an upper magnetron 140, a lower magnetron 145, an outer magnetron 150, an inner magnetron 155, and/or the like. In some embodiments, each of a plurality of outer magnetrons and a plurality of inner magnetrons shows a closed curve. In some instance, a distribution of at least one of outer magnetron 150 and inner magnetron 155 has a heart-like shape (also called as a heart curve, a heart surface or a rotated cardioid). The different portions of magnetron 130 may include different features. For example, upper magnetron 140 may include a portion of outer magnetron 150 and a portion of inner magnetron 155, and may include a continuous set of magnetic columns of the first type, as indicated by reference number 160. Lower magnetron 145 may include a remaining portion of outer magnetron 150 and a remaining portion of inner magnetron 155, and may include a discontinuous set of magnetic columns of the second type, as indicated by reference number 165. The set of magnetic columns of the second type are discontinuous since one or more magnetic columns are absent (e.g., removed) between two or more of the discontinuous set of magnetic columns, as indicated by reference number 170. For example, from an inner origin 171 shown in FIG. 1D, at least one magnetic column may be removed from inner magnetron 155 to adjust magnetic flux. Therefore, in some embodiments, a distribution of a right portion of inner magnetrons 155 is symmetrical to a distribution of a left portion of inner magnetrons 155; in some embodiments, the right portion is asymmetrical to the left portion. From an outer origin 172 shown in FIG. 1D, at least one magnetic columns and a left second magnetic column may be removed from outer magnetron 150 to adjust magnetic flux. Similarly, a distribution of a right portion of outer magnetrons 150 may be symmetrical to or asymmetrical to a distribution of a left portion of outer magnetrons 150.

As further shown in FIG. 1D, outer magnetron 150 includes a set of outer magnetic columns (e.g., 36 outer magnetic columns). In some implementations, more than approximately sixty-four percent (e.g., >64%) of the set of outer magnetic columns are the first type and more than approximately twenty percent (e.g., >20%) of the set of outer magnetic columns are the second type. As further shown, inner magnetron 155 may include a set of inner magnetic columns (e.g., 24 inner magnetic columns). In some implementations, more than approximately sixty-seven percent (e.g., >67%) of the set of inner magnetic columns are the first type and more than approximately twenty-two percent (e.g., >22%) of the set of inner magnetic columns are the second type. The distribution of the first type and second type of magnetic columns described above may prevent formation of voids in an conductive layer of the semiconductor device and may improve performance of the semiconductor device. In some embodiments, the conductive layer includes copper, aluminum, tantalum, and/or a combination thereof.

Figure 1E:
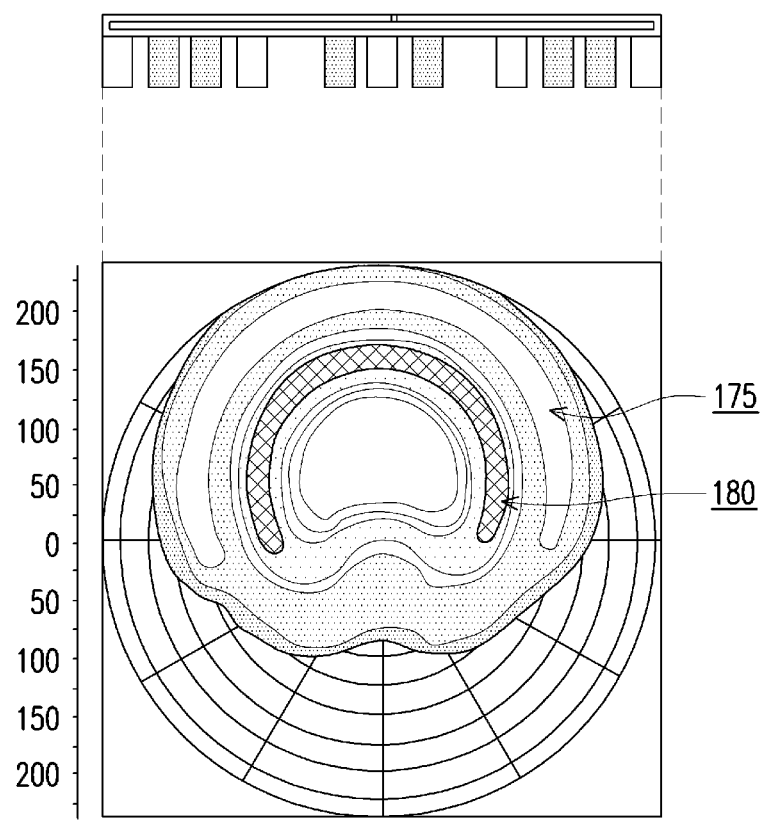

FIG. 1E is a diagram depicting magnetic fluxes generated by magnetron 130. As shown in FIG. 1E, and by reference number 175, outer magnetron 150 may generate an outer magnetic flux in a range from approximately one-hundred (100) Gauss to approximately eight-hundred and fifty (850) Gauss. In some implementations, outer magnetron 150 may generate an outer magnetic flux in a range from approximately one-hundred (100) Gauss to approximately one-thousand (1,000) Gauss. As further shown in FIG. 1E, and by reference number 180, inner magnetron 155 may generate an inner magnetic flux in a range from approximately two-hundred (200) Gauss to approximately nine-hundred and fifth (950) Gauss. In some implementations, inner magnetron 155 may generate an inner magnetic flux in a range from approximately one-hundred (100) Gauss to approximately one-thousand (1,000) Gauss. Other ranges of magnetic flux are possible for outer magnetron 150 and/or inner magnetron 155.

In this way, PVD chamber 105 prevents formation of voids in the aluminum copper layer of the semiconductor device and improves performance of the semiconductor device. Without formation of voids in the aluminum copper layer, a second insulation layer of the semiconductor device may completely cover the aluminum copper layer. Thus, a bumping chemical layer provided on top of the insulation layer is unable to contact the aluminum copper layer and/or cause damage to the aluminum copper layer.

As indicated above, FIGS. 1A-1E are provided merely as one or more examples. Other examples may differ from what is described with regard to FIGS. 1A-1E.

Figure 2A:
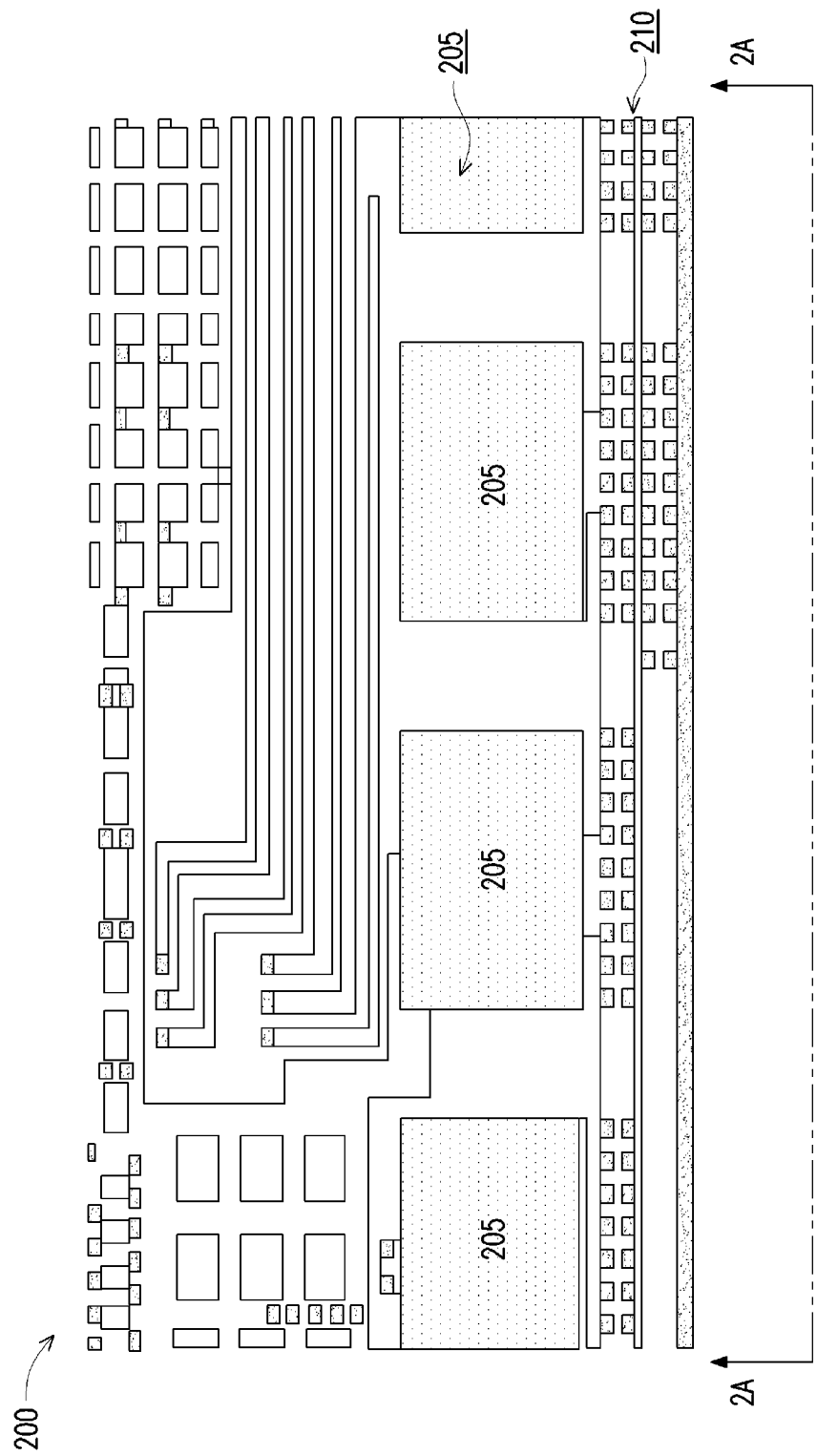
FIGS. 2A-2H are diagrams of an example semiconductor device and one or more operations involved in manufacturing the example semiconductor device.

FIGS. 2A-2H are diagrams of an example semiconductor device 200 (e.g., a logic device, a memory device, a micro-electro-mechanical systems (MEMS) device, and/or the like) and one or more operations involved in manufacturing the example semiconductor device 200. As shown in FIG. 2A, semiconductor device 200 may include a pad area 205, a redistribution via (RV) area 210, and one or more other components (e.g., circuits, contacts, metal levels, and/or the like). In some embodiments, pad area 205 includes at least one of aluminum, copper, gold, and a combination thereof. Pad area 205 includes an area of semiconductor device 200 where aluminum copper pads are formed by PVD chamber 105. Further details of the aluminum copper pads are described below in connection with FIGS. 2B-2H. RV area 210 includes an area of semiconductor device 200 where RVs are provided in semiconductor device 200. Any via failure in an interconnect of semiconductor device 200 (e.g., caused by electromigration, thermal stress, random defects, and/or the like) may be problematic for semiconductor device 200. Without violating any design for manufacturability (DFM) design rules and to improve via reliability, RVs of RV area 210 may provide alternative paths for failed vias.

Figure 2B:
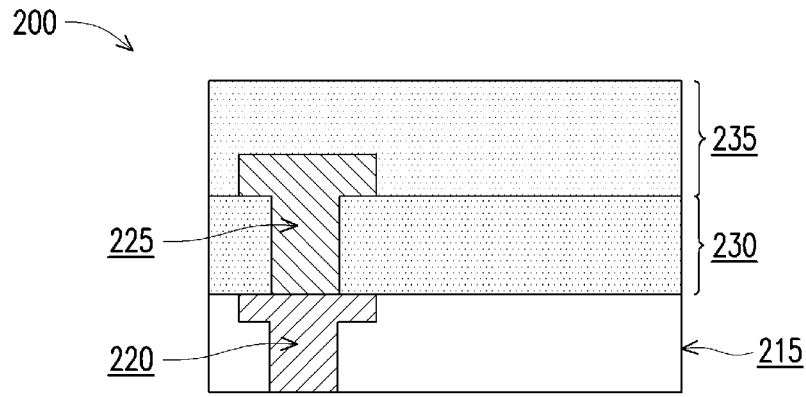

FIG. 2B is a cross-sectional views of an example implementation of semiconductor device 200, taken along line 2A-2A of FIG. 2A. As shown, semiconductor device 200 may include an inter-metal dielectric (IMD) layer 215 and a pad 220 formed within IMD layer 215. In some embodiments, pad 220 includes at least one of copper (Cu) or aluminum (Al). IMD layer 215 may include a metallization layer of semiconductor device 200 and may include a variety of materials (e.g., aluminum, nickel, chromium, gold, germanium, copper, silver, titanium, tungsten, platinum, tantalum, and/or the like). In some implementations, pad 220 is omitted from semiconductor device 200.

As further shown in FIG. 2B, semiconductor device 200 may include an aluminum copper (AlCu) pad 225 formed in an opening (e.g., a via) of a first insulation layer 230. Aluminum copper pad 225 and first insulation layer 230 may be provided on top of IMD layer 215, and aluminum copper pad 225 may contact IMD layer 215 and/or pad 220. Aluminum copper pad 225 may include conductive materials (e.g., aluminum and copper) that electrically interconnect IMD layer 215 and/or pad 220 to other conductive layers of semiconductor device 200. First insulation layer 230 may include material that insulates a portion of aluminum copper pad 225 from other components of semiconductor device 200 (e.g., other than IMD layer 215 and/or pad 220). For example, first insulation layer 230 may include tantalum nitride, silicon oxide, silicate glass, silicon oxycarbide, and/or the like.

As further shown in FIG. 2B, semiconductor device 200 may include a second insulation layer 235 provided on top of aluminum copper pad 225 and first insulation layer 230. Second insulation layer 235 may include material that insulates a portion of aluminum copper pad 225 from other components of semiconductor device 200 (e.g., other than IMD layer 215 and/or pad 220). For example, second insulation layer 235 may include tantalum nitride, silicon oxide, silicate glass, silicon oxycarbide, and/or the like.

Figure 2C:
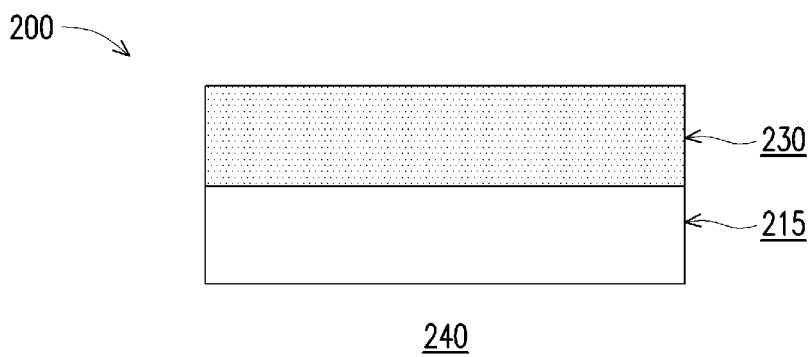

FIGS. 2C-2G are diagrams of processing operations involved in producing another example implementation of semiconductor device 200. In some implementations, one or more chambers of the pad tool configuration, described above in connection with FIG. 1A, are utilized to produce the other example implementation of semiconductor device 200. As shown in FIG. 2C, and by reference number 240, first insulation layer 230 may be provided on top of IMD layer 215. IMD layer 215 and first insulation layer 230 may include the features described above in connection with FIG. 2B. In some implementations, a TaN chamber of the pad tool configuration, described above in connection with FIG. 1A, may be utilized to provide first insulation layer 230 on top of IMD layer 215.

Figure 2D:
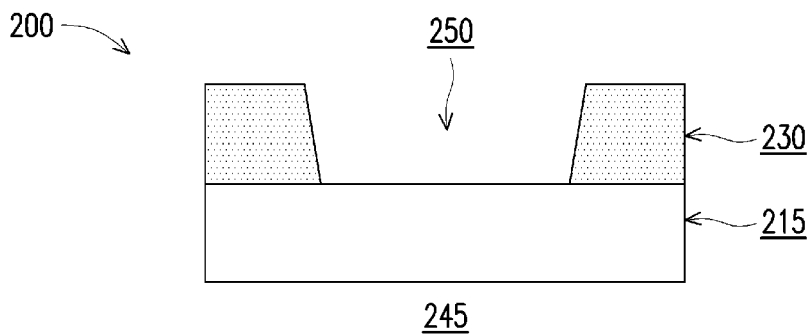

As shown in FIG. 2D, and by reference number 245, first insulation layer 230 may be etched to define a via 250 in first insulation layer 230. In some implementations, an etch chamber may utilize liquid chemicals, reaction gases, ion chemical reaction, and/or the like to define via 250 in first insulation layer 230. Alternatively, or additionally, other tools may be utilized to define via 250 in first insulation layer 230.

Figure 2E:
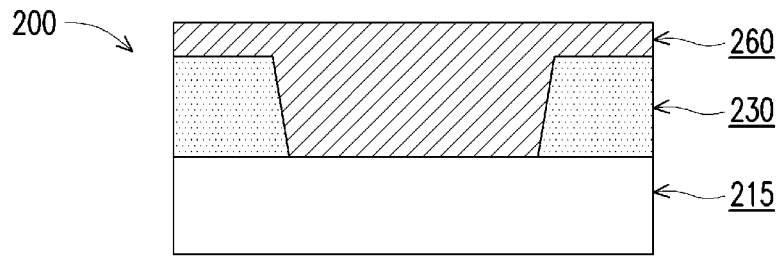

As shown in FIG. 2E, and by reference number 255, an aluminum copper (AlCu) layer 260 may be provided on top of first insulation layer 230 and in via 250 to contact a top surface of IMD layer 215. Aluminum copper layer 260 may include conductive materials (e.g., aluminum and copper) that electrically interconnect IMD layer 215 to other conductive layers of semiconductor device 200. Aluminum copper layer 260 may include an aspect ratio range from approximately 0.15 to approximately 1.1, a thickness range from approximately 0.7 micrometers to approximately 1.3 micrometers, a diameter range from approximately 1.2 micrometers to approximately 4 micrometers (e.g., where an aspect ratio is equivalent to a thickness divided by a diameter) to prevent formation of voids in aluminum copper layer 260 of the semiconductor device and to improve performance of the semiconductor device, as described herein. Other aspect ratio, thickness, and diameter ranges may be provided for aluminum copper layer 260. In some implementations, PVD chamber 105 of the pad tool configuration, described above in connection with FIG. 1A, may be utilized to provide aluminum copper layer 260 on top of first insulation layer 230 and in via 250. PVD chamber 105 may prevent formation of voids in aluminum copper layer 260 of semiconductor device 200, which improves performance of semiconductor device 200.

Figure 2F:
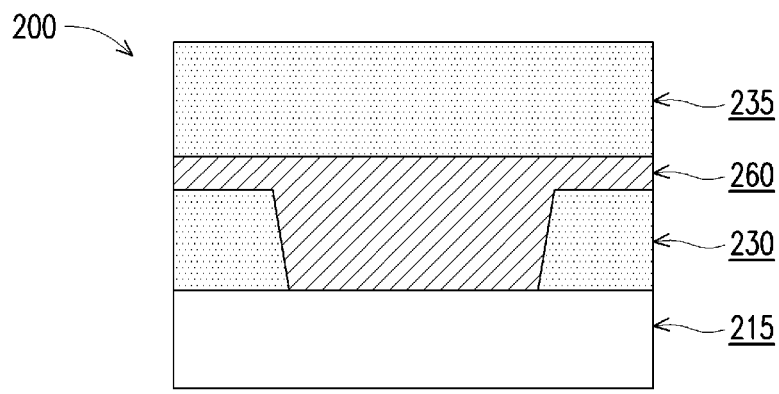

As shown in FIG. 2F, and by reference number 265, second insulation layer 235 may be provided on top of aluminum copper layer 260. Second insulation layer 235 may include the features described above in connection with FIG. 2B. In some implementations, a TaN chamber of the pad tool configuration, described above in connection with FIG. 1A, may be utilized to provide second insulation layer 235 on top of aluminum copper layer 260.

Figure 2G:
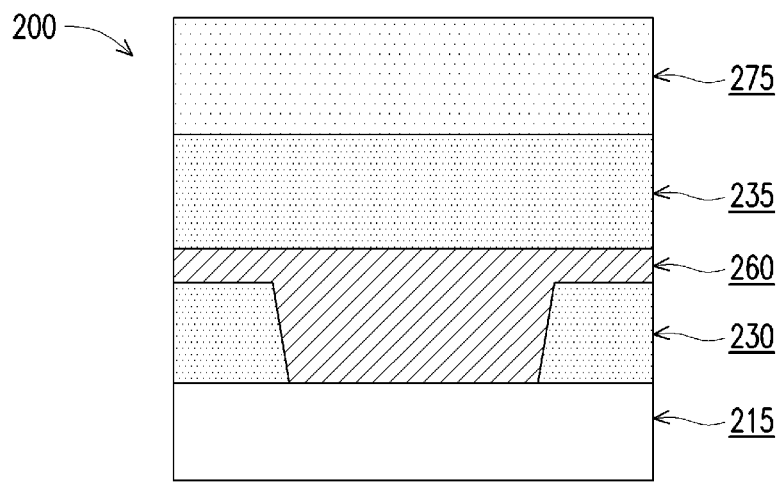

As shown in FIG. 2G, and by reference number 270, a bumping chemical layer 275 may be provided on top of second insulation layer 235. Bumping chemical layer 275 may include an acidic material that may etch one or more portions of second insulation layer 235, one or more portions of aluminum copper layer 260, and/or the like.

Figure 2H:
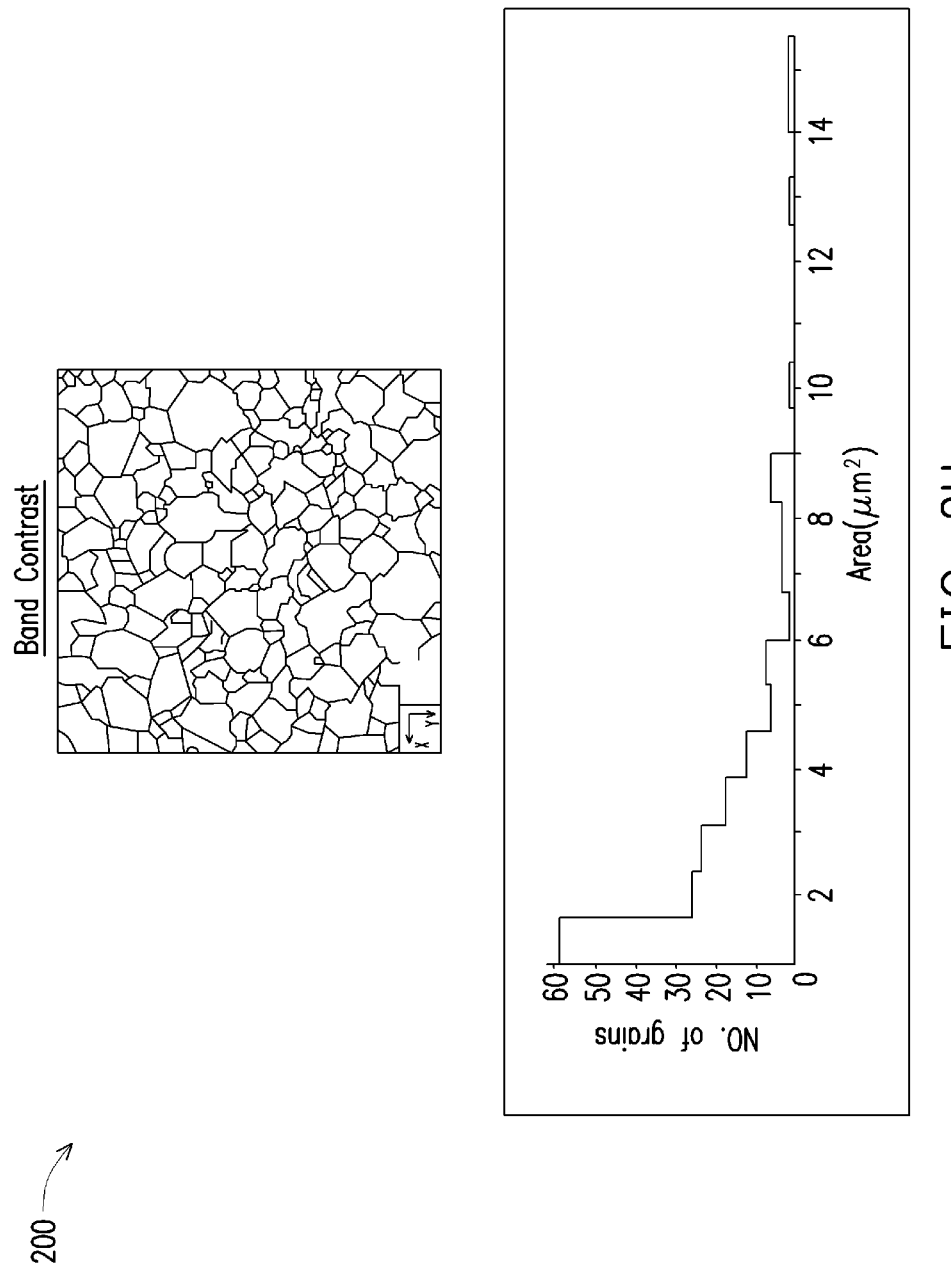

FIG. 2H is a diagram depicting an example of a band contrast associated with a grain area of aluminum copper layer 260, and a graph identifying an example of a quantity of grains associated with the grain area of aluminum copper layer 260. In comparison with other manufacturing approaches, more than ninety percent of the grain area of aluminum copper layer 260 is less than six square micrometers (e.g., <6 $\mu m^2$). The improvement in the grain area of aluminum copper layer 260 prevents voids from forming in aluminum copper layer 260.

In this way, semiconductor device 200 does not include voids in aluminum copper layer 260, which improves performance of semiconductor device 200. Without formation of voids in aluminum copper layer 260, second insulation layer 235 of semiconductor device 200 may completely cover aluminum copper layer 260. Thus, bumping chemical layer 275 provided on top of second insulation layer 235 is unable to contact aluminum copper layer 260 and/or cause damage to aluminum copper layer 260. Some implementations described herein may also be utilized with a resistive random-access memory device for ruthenium deposition gap fill improvement.

As indicated above, FIGS. 2A-2H are provided merely as one or more examples. Other examples may differ from what is described with regard to FIGS. 2A-2H.

Figure 3:
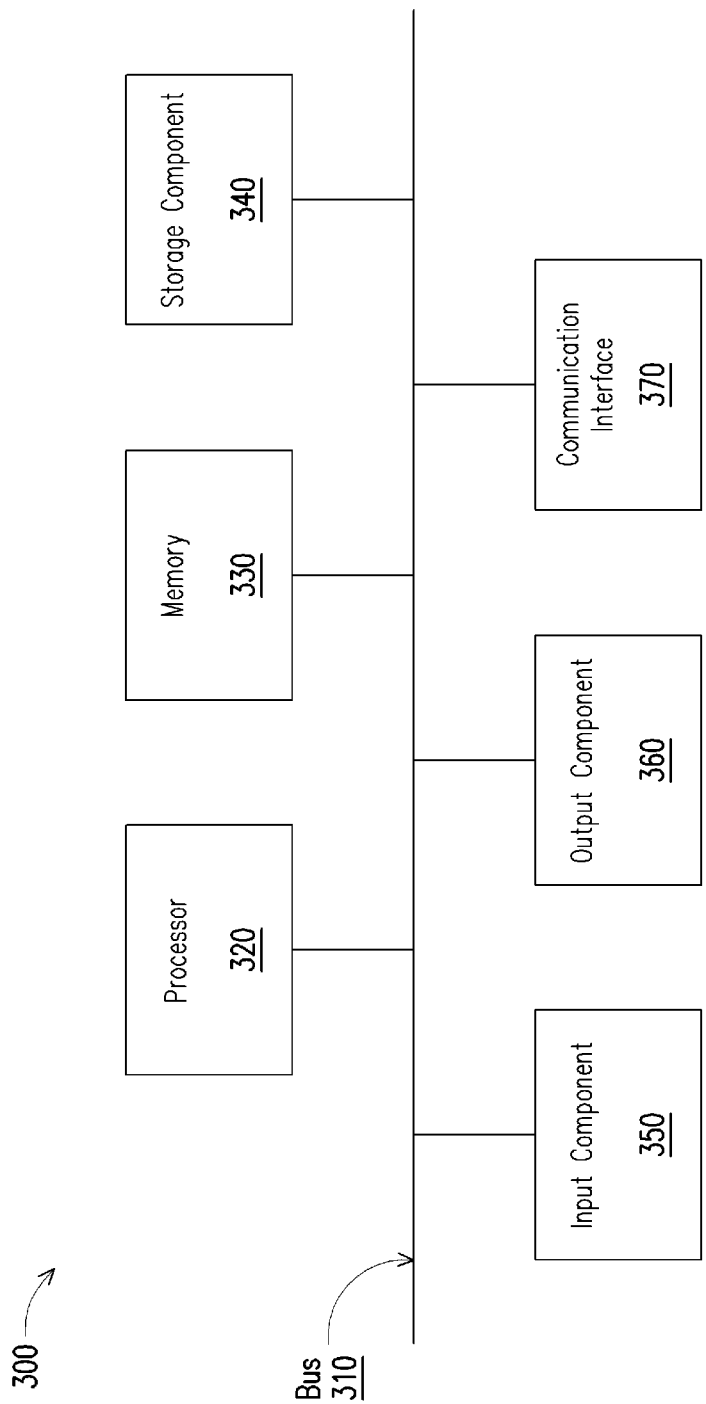
FIG. 3 is a diagram of example components of one or more devices of FIG. 1A.

FIG. 3 is a diagram of example components of a device 300. Device 300 may correspond to the degas chamber, the RPC chamber, the TaN chamber, and/or PVD chamber 105. In some implementations, the degas chamber, the RPC chamber, the TaN chamber, and/or PVD chamber 105 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, an RF interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
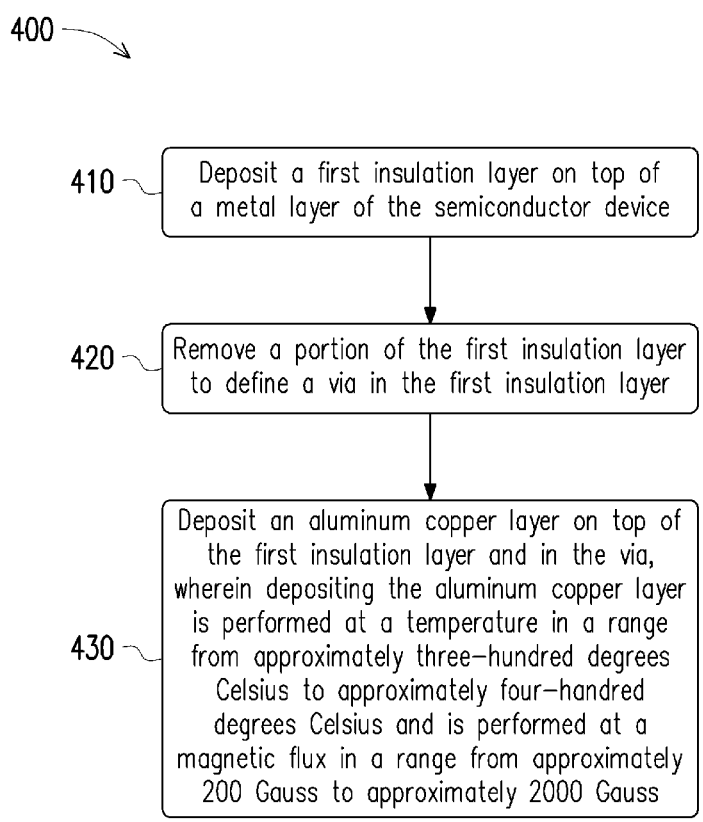
FIG. 4 is a flowchart of an example process for manufacturing an example semiconductor device based on a biased aluminum copper processing technique.

FIG. 4 is a flow chart of an example process 400 for manufacturing an example semiconductor device based on a biased aluminum copper processing technique. In some implementations, one or more process blocks of FIG. 4 may be performed by a device (e.g., one or more components of PVD chamber 105). In some implementations, one or more process blocks of FIG. 4 may be performed by another device or a group of devices separate from or including the device, such as a degas chamber, a reactive pre-clean chamber, a tantalum nitride chamber, and/or the like, and/or one or more other components of PVD chamber 105.

As shown in FIG. 4, process 400 may include depositing a first insulation layer on top of a metal layer of the semiconductor device (block 410). For example, the device (e.g., the TaN chamber) may deposit a first insulation layer 230 on top of a metal layer of the semiconductor device 215, as described above.

As further shown in FIG. 4, process 400 may include removing a portion of the first insulation layer to define a via in the first insulation layer (block 420). For example, the device (e.g., an etch chamber) may remove a portion of first insulation layer 230 to define a via 250 in first insulation layer 230, as described above.

As further shown in FIG. 4, process 400 may include depositing an aluminum copper layer on top of the first insulation layer and in the via, wherein depositing the aluminum copper layer is performed at a temperature in a range from approximately three-hundred degrees Celsius to approximately four-hundred degrees Celsius and is performed at a magnetic flux in a range from approximately 200 Gauss to approximately 2000 Gauss (block 430). For example, the device (e.g., using RF bias 110, chuck 115, target component 125, magnetron 130, and/or the like) may deposit an aluminum copper layer 260 on top of first insulation 230 layer and in via 250, as described above. In some implementations, depositing aluminum copper layer 260 is performed at a temperature in a range from approximately three-hundred degrees Celsius to approximately four-hundred degrees Celsius and is performed at a magnetic flux in a range from approximately 200 Gauss to approximately 2000 Gauss.

Process 400 may include additional implementations, such as any single implementation or any combination of implementations described below and/or in connection with one or more other processes described elsewhere herein.

In a first implementation, the device includes a chamber, chuck 115 provided in the chamber, and a biased power supply 110 physically connected with chuck 115. A target component 125 may be provided over chuck 115 and biased power supply 110, and a magnetron assembly 130 may be provided over target component 125. Magnetron assembly 130 may include a plurality of outer magnetrons 150 and a plurality of inner magnetrons 155, and a spacing between each adjacent magnetrons of the plurality of outer magnetrons 150 is different from a spacing between each adjacent magnetrons of the plurality of inner magnetrons 155.

In a second implementation, alone or in combination with the first implementation, the plurality of outer magnetrons 150 includes a first portion and a second portion, wherein a spacing between each adjacent magnetrons of the first portion is different from that between each adjacent magnetrons of the second portion.

In a third implementation, alone or in combination with one or more of the first and second implementations, chuck 115 is spaced from target component 125 in a range from approximately sixty millimeters to approximately eighty millimeters.

In a fourth implementation, alone or in combination with one or more of the first through third implementations, the device includes a cover ring 120 coupled with an edge of chuck 115, wherein cover ring 120 includes a first leg portion 122 shorter than a second leg portion 123.

In a fifth implementation, alone or in combination with one or more of the first through fourth implementations, biased power supply 110 is to provide a direct current power in a range from approximately twenty kilowatts to approximately sixty kilowatts and an alternating current in a range from approximately one-hundred Watts to approximately one-thousand, two-hundred Watts.

In a sixth implementation, alone or in combination with one or more of the first through fifth implementations, biased power supply 110 is to provide an alternating current biased power with a frequency in a range from approximately two megahertz to approximately eight-one megahertz.

In a seventh implementation, alone or in combination with one or more of the first through sixth implementations, the plurality of inner magnetrons 155 includes a first portion and a second portion, wherein a spacing between each adjacent magnetrons of the first portion is different from that between each adjacent magnetrons of the second portion.

In an eighth implementation, alone or in combination with one or more of the first through seventh implementations, spacings between each adjacent magnetrons of the first portion are consistent and spacings between each adjacent magnetrons of the second portion are inconsistent.

In a ninth implementation, alone or in combination with one or more of the first through eighth implementations, magnetron assembly 130 includes a plurality of magnetic columns, wherein a portion of the plurality of magnetic columns include column diameters in a range from approximately fifteen millimeters to approximately eighteen millimeters and column lengths in a range from approximately thirty millimeters to approximately thirty-five millimeters.

In a tenth implementation, alone or in combination with one or more of the first through ninth implementations, at least one of the first plurality of magnetrons or the second plurality of magnetrons has a heart-like shape.

In an eleventh implementation, alone or in combination with one or more of the first through tenth implementations, a portion of aluminum copper layer 260, provided in via 250, contacts metal layer 215 and is void free, and more than ninety percent of a grain area of aluminum copper layer 260 is less than six square micrometers.

In a twelfth implementation, alone or in combination with one or more of the first through eleventh implementations, a thickness of aluminum copper layer 260 is in a range from approximately seven thousand angstroms to approximately twenty-eight thousand angstroms.

In a thirteenth implementation, alone or in combination with one or more of the first through twelfth implementations, the semiconductor device comprises at least one of a logic device, a memory device, a micro-electro-mechanical systems device, and a high voltage device.

In a fourteenth implementation, alone or in combination with one or more of the first through thirteenth implementations, depositing aluminum copper layer 260 is performed to have an uniformity of aluminum copper layer 260 ranging from about 0.5% to about 1.7%.

In a fifteenth implementation, alone or in combination with one or more of the first through fourteenth implementations, providing aluminum copper layer 260 on top of first insulation layer 230 and in via 250 comprises providing aluminum copper layer 260 based on a magnetic field generated by magnetron 130 of the device.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, PVD chamber 105 prevents formation of voids in aluminum copper layer 260 of semiconductor device 200 and improves performance of semiconductor device 200. Without formation of voids in aluminum copper layer 260, second insulation layer 235 of semiconductor device 200 may completely cover aluminum copper layer 235. Thus, bumping chemical layer 275 provided on top of second insulation layer 235 is unable to contact aluminum copper layer 260 and/or cause damage to aluminum copper layer 260.

As described in greater detail above, some implementations described herein provide an apparatus for manufacturing a semiconductor device. The apparatus may include a chamber, a chuck provided in the chamber, and a biased power supply physically connected with the chuck. The apparatus may include a target component provided over the chuck and the biased power supply, and a magnetron assembly provided over the target component. The magnetron assembly may include a plurality of outer magnetrons and a plurality of inner magnetrons, and a spacing between each adjacent magnetrons of the plurality of outer magnetrons may be different from a spacing between each adjacent magnetrons of the plurality of inner magnetrons.

As described in greater detail above, some implementations described herein provide a method for manufacturing a semiconductor device. The method may include depositing a first insulation layer on top of a metal layer of the semiconductor device, and removing a portion of the first insulation layer to define a via in the first insulation layer. The method may include depositing an aluminum copper layer on top of the first insulation layer and in the via, wherein depositing the aluminum copper layer may be performed at a temperature in a range from approximately three-hundred degrees Celsius to approximately four-hundred degrees Celsius and may be performed at a magnetic flux in a range from approximately 200 Gauss to approximately 2000 Gauss.

As described in greater detail above, some implementations described herein provide a semiconductor device that includes a metal layer, and a first insulation layer provided on top of the metal layer, wherein a plurality of vias are formed in the first insulation layer. The semiconductor device may include an aluminum copper layer provided on top of the first insulation layer and in the plurality of vias. The aluminum copper layer may be provided at a temperature in a range from approximately three-hundred degrees Celsius to approximately four-hundred degrees Celsius to prevent formation of voids in the aluminum copper layer, and the temperature may be generated by a chuck component of a tool and the chuck component is powered by a biased power. The semiconductor device may include a second insulation layer provided on top of the aluminum copper layer, and a bumping chemical layer provided on top of the second insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a semiconductor device, the method comprising:
   depositing a first insulation layer on top of a metal layer of the semiconductor device;
   removing a portion of the first insulation layer to define a via in the first insulation layer; and
   depositing an aluminum copper layer on top of the first insulation layer and in the via,
      wherein depositing the aluminum copper layer is performed at a temperature in a range from approximately three-hundred degrees Celsius to approximately four-hundred degrees Celsius and is performed at a magnetic flux in a range from approximately 200 Gauss to approximately 2000 Gauss.

2. The method of claim 1, wherein a portion of the aluminum copper layer, provided in the via, contacts the metal layer and is void free, and
   wherein more than ninety percent of a grain area of the aluminum copper layer is less than six square micrometers.

3. The method of claim 2, wherein depositing the aluminum copper layer is performed by a biased power including an alternating current biased power with a frequency in a range from approximately two megahertz to approximately eighty-one megahertz.

4. The method of claim 1, further comprising:
   depositing a second insulation layer on top of the aluminum copper layer.

5. The method of claim 4, further comprising:
   depositing a bumping chemical layer on top of the second insulation layer.

6. The method of claim 1, wherein a thickness of the aluminum copper layer is in a range from approximately seven thousand angstroms to approximately twenty-eight thousand angstroms.

7. The method of claim 1, wherein the semiconductor device comprises at least one of:
   a logic device,
   a memory device,
   a micro-electro-mechanical systems device, and
   a high voltage device.

8. The method of claim 1, wherein depositing the aluminum copper layer is performed to have a uniformity of the aluminum copper layer ranging from about 0.5% to about 1.7%.

9. The method of claim 1, wherein providing the aluminum copper layer on top of the first insulation layer and in the via comprises:
providing the aluminum copper layer based on a magnetic field generated by a magnetron of a tool.

10. The method of claim 1, further comprising:
forming a pad within the metal layer,
wherein at least a portion of the pad is in contact with at least a portion of the aluminum copper layer.

11. A semiconductor device, comprising:
a metal layer;
a first insulation layer provided on top of the metal layer,
wherein a plurality of vias are formed in the first insulation layer;
an aluminum copper layer provided on top of the first insulation layer and in the plurality of vias,
wherein approximately ninety-one percent of a grain area of the aluminum copper layer is less than approximately six square micrometers;
a second insulation layer provided on top of the aluminum copper layer; and
a bumping chemical layer provided on top of the second insulation layer.

12. The semiconductor device of claim 11, wherein at least one of:
a thickness of the aluminum copper layer is in a range from approximately seven thousand angstroms to approximately twenty-eight thousand angstroms, or
a ratio of the thickness to a diameter of the aluminum copper layer is a range from approximately 0.15 to approximately 1.1.

13. The semiconductor device of claim 11, wherein portions of the aluminum copper layer, provided in the plurality of vias, contact the metal layer and are void free.

14. The semiconductor device of claim 11, further comprising at least one of:
a logic device,
a memory device,
a micro-electro-mechanical systems device, and
a high voltage device.

15. The semiconductor device of claim 11, wherein a uniformity of the aluminum copper layer ranges from about 0.5% to about 1.7%.

16. The semiconductor device of claim 11, wherein the aluminum copper layer is provided at a temperature in a range from approximately three-hundred degrees Celsius to approximately four-hundred degrees Celsius to prevent formation of voids in the aluminum copper layer, and
wherein the temperature is generated by a chuck component of a tool and the chuck component is powered by a biased power.

17. The semiconductor device of claim 11, wherein the bumping chemical layer includes an acidic material.

18. A method for manufacturing a semiconductor device, the method comprising:
depositing a first insulation layer on top of a metal layer of the semiconductor device;
forming one or more vias in the first insulation layer;
providing heat to the semiconductor device,
a temperature of the heat being in a range from approximately three-hundred degrees Celsius to approximately four-hundred degrees Celsius; and
depositing, based on providing the heat to the semiconductor device, an aluminum copper layer on top of the first insulation layer and in the one or more vias,
wherein depositing the aluminum copper layer is performed at a magnetic flux in a range from approximately 200 Gauss to approximately 2000 Gauss.

19. The method of claim 18, further comprising:
depositing a second insulation layer on top of the aluminum copper layer.

20. The method of claim 19, further comprising:
depositing a bumping chemical layer on top of the second insulation layer.

* * * * *